United States Patent
Küchenmeister et al.

(10) Patent No.: US 11,557,421 B2
(45) Date of Patent: Jan. 17, 2023

(54) INTEGRATED CIRCUIT STRUCTURE WITH DIELECTRIC MATERIAL TO COVER HORIZONTALLY SEPARATED METAL LAYERS, AND RELATED METHOD

(71) Applicant: GLOBALFOUNDRIES Dresden Module One Limited Liability Company & Co. KG, Dresden (DE)

(72) Inventors: Frank G. Küchenmeister, Dresden (DE); Marcel B. Wieland, Dresden (DE); Hartmuth Daniel Kunze, Ottendorf-Okrilla (DE); Lothar E. Lehmann, Radebeul (DE); Sven Bedürftig, Laubusch (DE); Patrick Rohlfs, Dresden (DE)

(73) Assignee: GlobalFoundries Dresden Module One Limited Liability Company & Co. KG, Dresden (DE)

( * ) Notice: Subject to any disclaimer, the term of this patent is extended or adjusted under 35 U.S.C. 154(b) by 435 days.

(21) Appl. No.: 16/809,689

(22) Filed: Mar. 5, 2020

(65) Prior Publication Data
US 2021/0280352 A1   Sep. 9, 2021

(51) Int. Cl.
*H01F 27/28*   (2006.01)
*H01L 49/02*   (2006.01)
(Continued)

(52) U.S. Cl.
CPC ..... *H01F 27/2804* (2013.01); *H01F 17/0006* (2013.01); *H01F 27/32* (2013.01);
(Continued)

(58) Field of Classification Search
CPC ............. H01L 28/10; H01F 2017/0073; H01F 27/2804; H01F 27/323
See application file for complete search history.

(56) References Cited

U.S. PATENT DOCUMENTS 5,310,720 A * 5/1994 Shin .................. H01L 21/31051
257/E21.243
5,519,582 A * 5/1996 Matsuzaki .............. H01L 24/73
361/783

(Continued)

OTHER PUBLICATIONS

C. H. Kuo et al., "C4 Compatible Ultra-Thick Cu On-chip Magnetic Inductor Architecture Integrated with Advanced Polymer/Cu Planarization Process," IEEE 69th Electronic Components and Technology Conference (ECTC), 2019, 4 pages.

(Continued)

*Primary Examiner* — Peniel M Gumedzoe
(74) *Attorney, Agent, or Firm* — Anthony Canale; Hoffman Warnick LLC (57) ABSTRACT

Embodiments of the disclosure provide an integrated circuit (IC) structure. The IC structure may include a first metal layer on a substrate, and a second metal layer on the substrate that is horizontally separated from the first metal layer. A dielectric material may include a first portion on the first metal layer, and having a first upper surface, a second portion on the second metal layer, and having a second upper surface, and a third portion on the substrate between the first metal layer and the second metal layer. The third portion of the dielectric material includes a third upper surface above the first upper surface of the first portion and the second upper surface of the second portion of the dielectric material.

14 Claims, 10 Drawing Sheets

(51) Int. Cl.
  *H01L 21/768* (2006.01)
  *H01L 21/02* (2006.01)
  *H01F 27/32* (2006.01)
  *H01F 41/04* (2006.01)
  *H01F 41/12* (2006.01)
  *H01F 17/00* (2006.01)

(52) U.S. Cl.
  CPC ......... *H01F 27/323* (2013.01); *H01F 41/041* (2013.01); *H01F 41/12* (2013.01); *H01L 21/02118* (2013.01); *H01L 21/76877* (2013.01); *H01L 28/10* (2013.01); *H01F 2017/0073* (2013.01); *H01F 2027/2809* (2013.01)

(56) References Cited

U.S. PATENT DOCUMENTS

| | | |
|---|---|---|
| 9,693,461 B2 | 6/2017 | Zhao et al. |
| 9,704,843 B2 | 7/2017 | Kilger |
| 10,102,967 B2 | 10/2018 | Beer et al. |
| 10,186,481 B2 | 1/2019 | Wojnowski et al. |
| 10,269,732 B2 | 4/2019 | Yu et al. |
| 10,297,657 B2 | 5/2019 | Liao |
| 10,470,309 B2 | 11/2019 | Erturk et al. |

OTHER PUBLICATIONS

Jean-Philippe Michel et al., "Ultra-Low Profile Integrated Magnetic Inductors and Transformers for HF Applications," IEEE Transactions on Magnetics, vol. 55, No. 7, Jul. 2019, 7 pages.

\* cited by examiner

INTEGRATED CIRCUIT STRUCTURE WITH DIELECTRIC MATERIAL TO COVER HORIZONTALLY SEPARATED METAL LAYERS, AND RELATED METHOD

TECHNICAL FIELD

Embodiments of the disclosure relate generally to integrated circuit (IC) technology. More specifically, the disclosure relates to an IC structure with a dielectric material to cover horizontally separated metal layers, and related methods.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at nanometer level scaling of certain micro-devices such as inductors, transistors, resistors, and capacitors. Circuit chips with hundreds of millions of such devices are common.

Circuit fabricators are currently seeking to reduce the two-dimensional area occupied by device components, e.g., to reduce two dimensional area and power consumption while maintaining compliance with performance metrics. The fabrication of inductors in microcircuitry is especially challenging because an inductor's surface area will control its inductance during operation. In the case of magnetic elements such as wire coil inductors, such concerns may be especially important because alignment between the inductor and overlying materials, e.g., a corresponding magnetic core, will affect parameters such as magnetic field strength, inductance, etc. The processes implemented to form inductors, as well as other devices such as resistors and capacitors, may also affect the characteristics of other devices. Modifying a device structure to control electrical parameters such as inductance may affect other constraints, e.g., the planarity or thickness of overlying materials.

SUMMARY

Aspects of the disclosure provide an integrated circuit (IC) structure, including: a first metal layer on a substrate; a second metal layer on the substrate, and horizontally separated from the first metal layer; and a dielectric material including: a first portion on the first metal layer, and having a first upper surface, a second portion on the second metal layer, and having a second upper surface, and a third portion on the substrate between the first metal layer and the second metal layer, wherein the third portion of the dielectric material includes a third upper surface above the first upper surface of the first portion and the second upper surface of the second portion of the dielectric material.

Further aspects of the disclosure provide an inductor structure, including: a metal coil including a plurality of linearly connected metal layers on a substrate, the plurality of linearly connected metal layers including a first metal layer on the substrate and a second metal layer on the substrate having a portion horizontally separated from the first metal layer; a dielectric material including: a first portion on the first metal layer of the metal coil, and having a first upper surface, a second portion on the second metal layer of the metal coil, and having a second upper surface, and a third portion on the substrate between the first metal layer and the second metal layer of the metal coil, wherein the third portion of the dielectric material includes a third upper surface above the first upper surface of the first portion and the second upper surface of the second portion of the dielectric material; a magnetic material on the dielectric material above the first metal layer of the metal coil; and a via contacting an upper surface of the second metal layer of the metal coil, and extending through the second portion of the dielectric material.

Another aspect of the disclosure provides a method of forming an integrated circuit (IC) structure, the method including: forming a first metal layer and a second metal layer on a substrate, wherein the second metal layer is horizontally separated from the first metal layer; forming a first dielectric material on the substrate between the first metal layer and the second metal layer, wherein the first dielectric material includes an upper surface above the first metal layer and the second metal layer; and forming a second dielectric material on the first metal layer, the second metal layer, and the first dielectric material, wherein the second dielectric material includes a first portion having a first upper surface over the first metal layer, a second portion having a second upper surface over the second metal layer, and third portion having a third upper surface over the substrate between the first portion and the second portion, wherein the third upper surface is above the first upper surface of the first portion and the second upper surface of the portion of the dielectric material.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an integrated circuit (IC) structure with one or more dielectric materials formed on first and second metal layers. The first and second metal layers, in some cases, may be portions of a metal coil formed on a substrate. In the case of a metal coil, the first and second metal layers may be portions of an inductor structure. The dielectric material(s) structure may improve the planarity of overlying features, e.g., magnetic materials, vias, wires, etc. In particular, the dielectric materials may include a raised surface of limited height only between horizontally separated metal layers, e.g., turns of a metal coil. Such surfaces may prevent significant peaks and valleys from being formed within overlying structures.

The dielectric material may include a first portion on the first metal layer, a second portion on the second metal layer, and a third portion on the substrate between the first metal layer and the second metal layer. Each portion of the dielectric material may include an upper surface, and an upper surface of the third portion may be above the upper surface of the first portion and the upper surface of the second portion. Such characteristics of the dielectric material may arise from, e.g., using a mask to form dielectric material between the first metal layer and the second metal layer, and a second mask to form overlying vias to one of the two metal layers. In any case, the dielectric material(s) with these physical characteristics may provide greater planarity of overlying wires, vias, and magnetic material, as compared to conventional structures. Methods according to the disclosure may provide such a structure without implementing any planarization materials and/or processes (e.g., chemical mechanical planarization (CMP)) on the initial structure.

Figure 1:
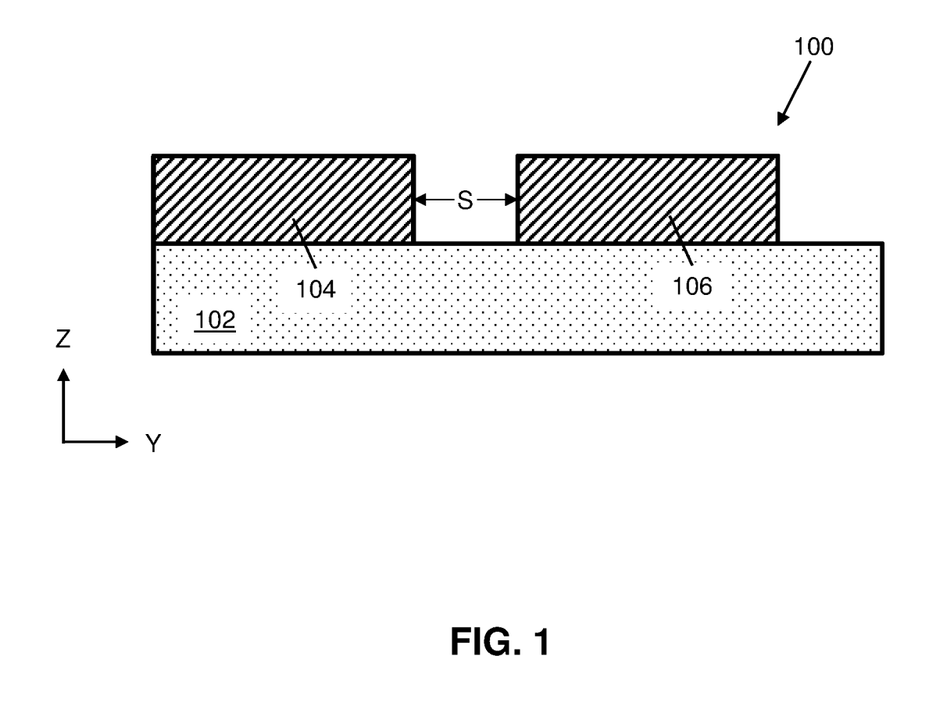
FIG. 1 provides a cross-sectional view in plane Y-Z of forming first and second metal layers on a substrate, according to embodiments of the disclosure.

Referring to FIG. 1, embodiments of the disclosure provide methods to form an IC structure. FIG. 1 illustrates an initial structure 100 (simply "structure" hereafter) capable of being processed to form an IC structure according to embodiments of the disclosure. Structure 100 may be formed on a substrate 102 including, e.g., silicon and/or silicon in conjunction with one or more semiconductor materials. Various additional semiconductor materials suitable for inclusion within substrate 102 may include silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained. Although substrate 102 is shown for the sake of example as being a bulk layer, substrate 102 alternatively may take the form of a semiconductor on insulator (SOI) substrate, a semiconductor fin extending vertically above an insulator layer including glass carriers, mold compounds or any other similar materials, and/or any other currently known or later developed type of substrate structure. Substrate 102, in further examples, may include one or more layers of dielectric material for separating successive metal layers from each other. For example, substrate 102 may take the form of an inter-level dielectric (ILD) material having one or more example materials discussed below with respect to back end of line (BEOL) processing.

Methods according to the disclosure may include forming a group of conductive metals on substrate 102, e.g., a first metal layer 104 and a second metal layer 106 on substrate 102. First metal layer 104 and second metal layer 106 may be horizontally separated from each other by a gap S, thus exposing a portion of substrate 102 between each metal layer 104, 106. First metal layer 104 and second metal layer 106 may generally include one or more electrically conductive materials configured to interconnect multiple elements of a circuit, e.g., between various device structures and/or to other components such as external structures or devices. First metal layer 104 and second metal layer 106 may be formed of copper, aluminum, and/or other conductive materials suitable for serving as a wire in an IC structure. First metal layer 104 and second metal layer 106 may initially be formed as a single, continuous layer on substrate 102 which may be processed (e.g., by targeted etching) to form metal layers 104, 106 of a desired shape and size. First metal layer 104 and second metal layer 106 in some cases may be structurally discontinuous as shown in FIG. 1, and in further embodiments each metal layer 104, 106 may form a portion of a single metal coil such as those used in an inductor.

Figure 2:
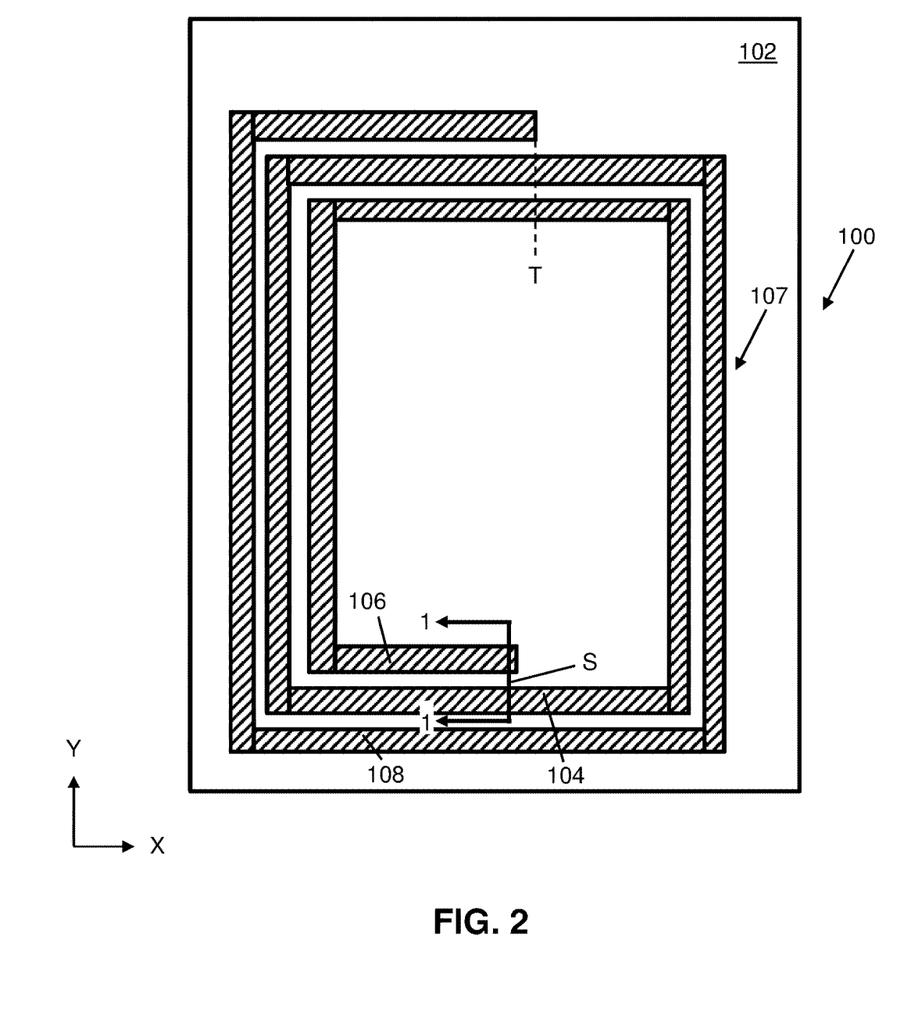
FIG. 2 provides a plan view in plane X-Y of the first and second metal layers as part of an inductor structure, according to embodiments of the disclosure.

Referring now to FIG. 2, a plan view of structure 100 is shown according to further embodiments. Here, first metal layer 104 and second metal layer 106 represent portions of a metal coil 107 formed on substrate 102. In this example, the cross-sectional view of FIG. 1 is shown to be along view line 1-1 of FIG. 2. Metal coil 107 may generate a magnetic field via Faraday's Law during operation of a device. Thus, metal coil 107 may be formed of multiple interconnected conductors, e.g., first metal layer 104, second metal layer 106, a third metal layer 108, and/or multiple additional metal layers in further implementations. It is understood that metal coil 107 may include dozens or even hundreds of coiled metal layers on substrate 102, and that three metal layers 104, 106, 108 are shown in FIG. 2 solely for ease of illustration. A dividing line T (shown in phantom) may represent an identification boundary between each metal layer 104, 106, 108 of metal coil 107, and the position of dividing line T may not have physical significance apart from calculating the number of turns in metal coil 107. Thus, metal layers 104, 106, 108 may be structurally continuous portions of a single metal layer and may be identified herein as separate layers solely by reference to the cross-sectional view of FIG. 1. In further embodiments, metal layers 104, 106, 108 may not be structurally contiguous and/or may be formed from different materials (e.g., in the case of resistors, capacitors, transistors, and/or other structures which include one or more metals). Metal coil 107 may be electrically coupled to one or more elements formed above metal coil 107, e.g., by a set of subsequently-formed vias formed at various locations on metal coil 107.

Figure 3:
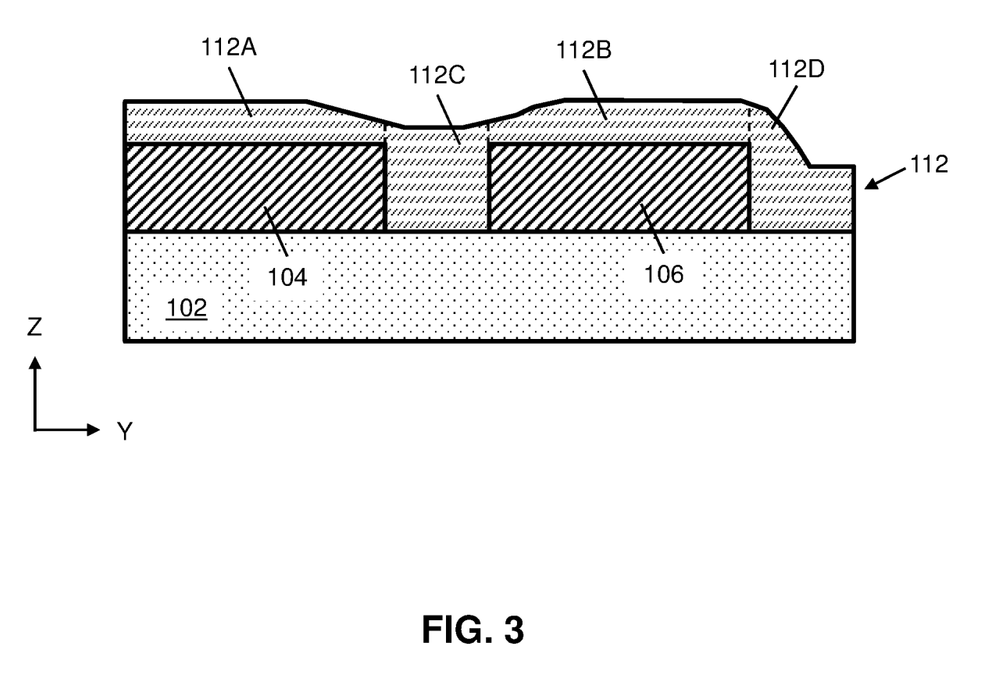
FIG. 3 provides a cross-sectional view in plane Y-Z of forming a first dielectric material on the substrate and the first and second metal layers, according to embodiments of the disclosure.

Referring now to FIG. 3, embodiments of the disclosure may include forming dielectric materials on first metal layer 104 and second metal layer 106. Third metal layer 108 is omitted from the cross-sectional view shown in FIG. 3, and subsequent FIGS. 4-7, solely for clarity of illustration. The disclosure may include forming a first dielectric material 112 on substrate 102, first metal layer 104, and second metal layer 106, e.g., by non-selective deposition (e.g., spin-on deposition) of one or more dielectric materials. First dielectric material 112 may include one or more currently known or later developed materials capable of operating as a photoresist layer. A photoresist layer refers to any photosensitive material used in photolithography to transfer a pattern from a mask onto a wafer. In this case, first dielectric material 112 may be formed as a liquid and solidified by a low temperature anneal. First dielectric material 112 may include one or more layers of polymer material, e.g., one or more photosensitive polyimides (PSPIs), benzocyclobutene (BCB), epoxy, poly(p-phenylene-2,6-benzobisoxazole (PBO), and/or similar materials alone or in any conceivable combination.

Initially, first dielectric material 112 may be subdivided into multiple portions that are distinguishable from each other based on the structure(s) where dielectric material 112 is formed. For instance, first dielectric material 112 may include a first portion overlying first metal layer 104, a second portion 112B overlying second metal layer 106, and a third portion 112C between first metal layer 104 and second metal layer 106. First dielectric material 112 may also include a fourth portion 112D over substrate 102 and, for example, adjacent second metal layer 106. In some cases, one or more portions 112A, 112B, 112C, 112D of first dielectric material 112 may be distinguished from each other based on their relative heights above substrate 102. For instance, first portion 112A and/or second portion 112B may have an increased height above substrate 102 as compared to third portion 112C and/or fourth portion 112D. The difference in heights above substrate 102 may arise from first portion 112A and/or second portion 112B being formed on metal layer(s) 104, 106, while third portion 112C and/or fourth portion 112D may be formed directly on substrate 102. Apart from height differences between each portion 112A, 112B, 112C, 112D, first dielectric material 112 may be a unitary layer with no compositional differences and/or physical interfaces between each portion 112A, 112B, 112C, 112D.

Figure 4:
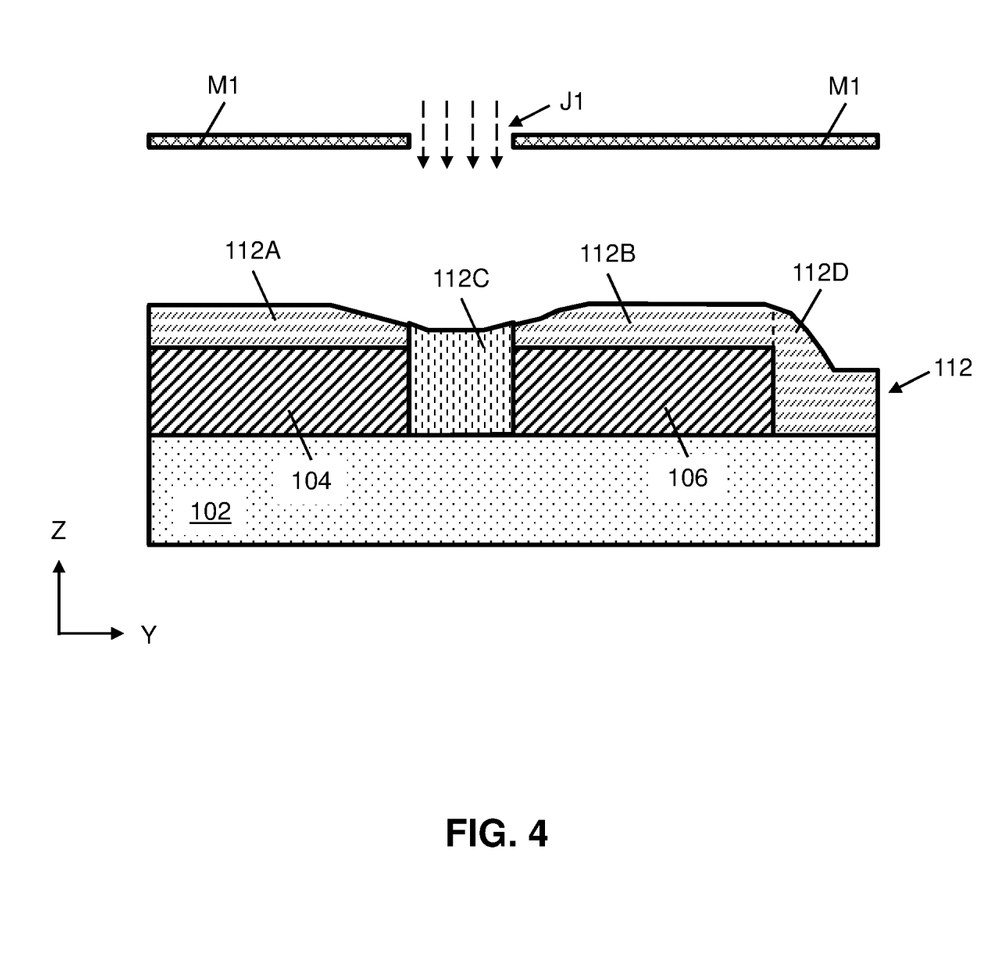
FIG. 4 provides a cross-sectional view of targeting portions of the first dielectric material for removal using a first mask, according to embodiments of the disclosure.

Referring now to FIG. 4, embodiments of the disclosure may include targeting selected areas of first dielectric material 112 for removal, while leaving other portions of first dielectric material 112 substantially intact. According to an example, first dielectric material 112 may take the form of a "negative resist," i.e., one or more dielectric materials that are initially soluble to etchants in a developer material, but capable of becoming insoluble after irradiation. A first mask M1 may include an opening J1 positioned over third portion 112C of first dielectric material. First mask M1 may cover the other portions 112A, 112C, 112D of dielectric material 112. With first mask M1 in place, third portion 112C may be irradiated and thus rendered insoluble to selective etchants. Other portions 112A, 112B, 112D of dielectric material 112 may be non-irradiated and thus may remain soluble to selective etchants. The non-irradiated portions 112A, 112B, 112D thus may be removed in subsequent processing, e.g., by one or more etchant materials. In further embodiments, e.g., where first dielectric material takes the form of a "positive resist," first dielectric material 112 may be initially insoluble, and thus not capable of being removed by one or more etchant materials. In this case, portions 112A, 112B, 112D may be irradiated with mask M1 in place over second portion 112C to render portions 112A, 112B, 112D soluble to etchants.

Figure 5:
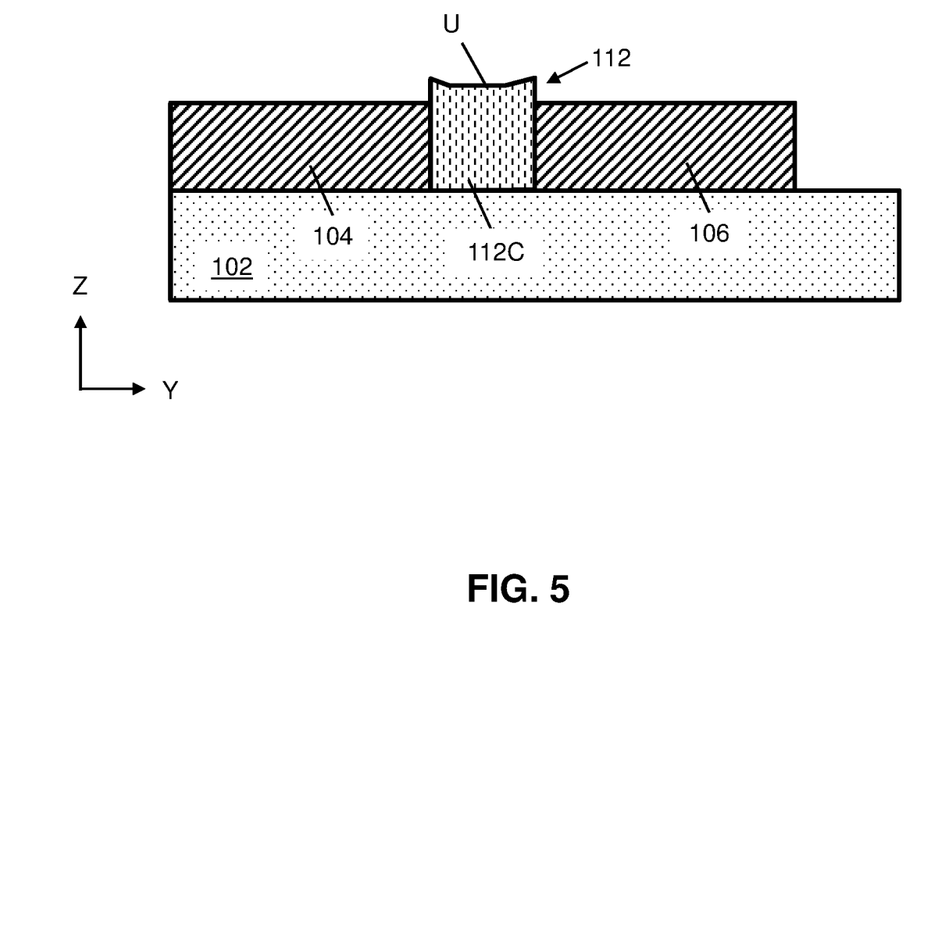
FIG. 5 provides a cross-sectional view of removing portions of the first dielectric material over the first and second metal layers, according to embodiments of the disclosure.

Turning to FIG. 5, embodiments of the disclosure may include removing first portion 112A, second portion 112B, and fourth portion 112D of first dielectric material 112, e.g., by contacting first dielectric material 112 with one or more selective etchants. Etchants suitable for use with polymer materials may include, e.g., a metallic hydroxide solution such as those containing one or more alkali metal hydroxide materials, and/or other solutions having similar properties. Upon contacting first dielectric material 112 after irradiating selected portions thereof, third portion 112C of first dielectric material 112 may remain between first metal layer 104 and second metal layer 106. Additionally, third portion 112C may extend completely horizontally from first metal layer 104 to second metal layer 106. In this case, first dielectric material 112 may completely cover substrate 102 between metal layers 104, 106. Third portion 112C may continue to include an upper surface U that is positioned above first metal layer 104 and second metal layer 106. All other portions 112A, 112B, 112D (FIGS. 3, 4) of first dielectric material 112 may be removed after the etching concludes.

Figure 6:
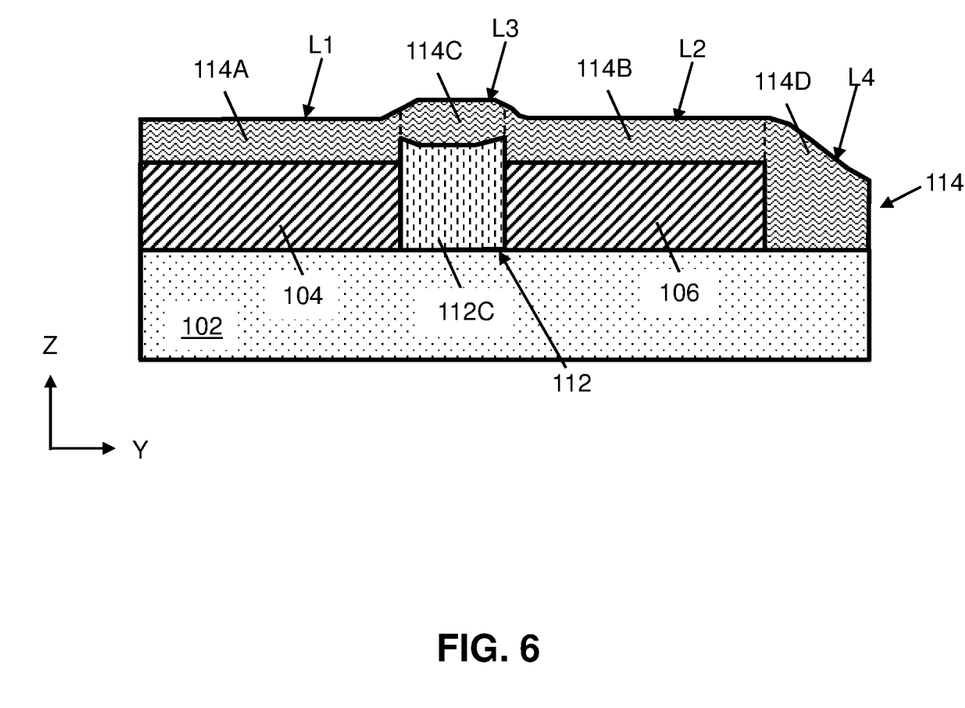
FIG. 6 provides a cross-sectional view of forming a second dielectric material on the first dielectric material and the first and second metal layers, according to embodiments of the disclosure.

Turning to FIG. 6, embodiments of the disclosure may include forming a second dielectric material 114 over first metal layer 104, second metal layer 106, and second portion 112B of first dielectric material 112. As will be discussed below, second dielectric material 114 may be formed and processed to cover first metal layer 104 and second metal layer 106, such that second dielectric material 114 exhibits more planarity than may be achievable using only a single dielectric material and/or mask. Second dielectric material 114 may include one or more of the same materials included within first dielectric material 112, e.g., one or more photoresist materials such as a polymer material. In various implementations, the material(s) included within second dielectric material 114 may be the same as, or different from, first dielectric material 112. First dielectric material 112 and second dielectric material 114 are illustrated with two different types of cross-hatching solely for ease of identification. Second dielectric material 114 may be formed on substrate 102, first metal layer 104, second metal layer 106, and first dielectric material 112 by deposition or by any other currently known or later developed process to form one or more dielectric materials on a structure. Second dielectric material 114 may include, e.g., one or more photosensitive polyimides (PSPIs), benzocyclobutene (BCB), epoxy, poly (p-phenylene-2,6-benzobisoxazole (PBO), and/or similar materials alone or in any conceivable combination. In some cases, the composition of second dielectric material 114 may be different from that of first dielectric material 112.

At the time of formation, second dielectric material may include a first portion 114A over first metal layer 104, a second portion 114B over second metal layer 106, a third portion 114C over first dielectric material 112, and in some cases, a fourth portion 114D over substrate 102. Where applicable, fourth portion 114D may be formed directly on an upper surface of substrate 102 adjacent the outer perimeter of metal layers 104, 106, as shown. Each portion 114A, 114B, 114C, 114D of second dielectric material 114 may be deposited together and thus may be chemically indistinct from each other. However, portions 114A, 114B, 114C, 114D may be physically distinguished from each other based on their relative heights above substrate 102 and/or their underlying materials. First portion 114A may include a first upper surface L1, second portion 114B may have a second upper surface L2, third portion 114C may have a third upper surface L3, and fourth portion 114D may have a fourth upper surface L4. Third upper surface L3 may be above first upper surface L1 and second upper surface L2, in addition to being above fourth upper surface L4. Fourth upper surface L4 by contrast may be below first upper surface L1, second upper surface L2, and third upper surface L3. With second dielectric material 114 in place, first metal layer 104 and second metal layer 106 may be ready for overlying materials (e.g., magnetic substances and/or vias for an inductor), to be formed thereon.

Figure 7:
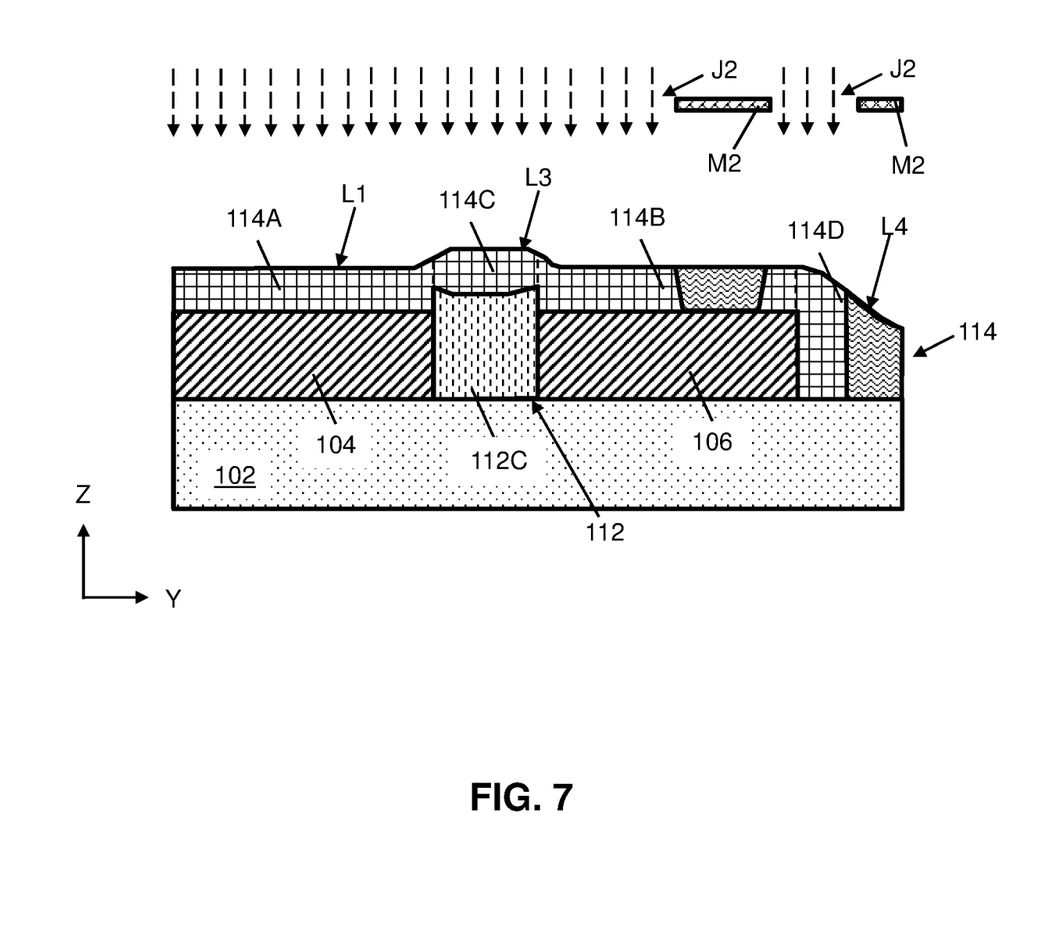
FIG. 7 provides a cross-sectional view of targeting portions of the second dielectric material for removal using a second mask, according to embodiments of the disclosure.

Turning to FIG. 7, embodiments of the disclosure may include using a second mask M2 to target portions of second dielectric material 114 for removal. Where second dielectric material 114 takes the form of a negative resist, second mask M2 may include openings J2 over portions of second dielectric material 114 that are not targeted for removal, e.g., first portion 114A, third portion 114C, selected areas of second portion 114B, and/or selected areas of fourth portion 114D. Second mask M2 may be vertically aligned with portions of second dielectric material 114 that are targeted for removal, e.g., the intended location of vias and/or other materials to be formed above substrate 102. With second mask M2 in place, various portions of second dielectric material 114 be irradiated and thus rendered insoluble to etchants. Other portions, e.g., areas of second portion 114B and/or 114D covered by second mask M2, may be non-irradiated and thus may remain soluble to etchants. The non-irradiated areas of second portion 114B and/or fourth portion 114D may be removed in subsequent processing, e.g., by one or more etchant materials. In cases where second dielectric material 114 takes the form of a "positive resist," openings J2 of second mask M2 may be positioned to irradiate portions of second dielectric material 114 that are targeted for removal, with non-irradiated portions of material remaining non-susceptible to etching.

Figure 8:
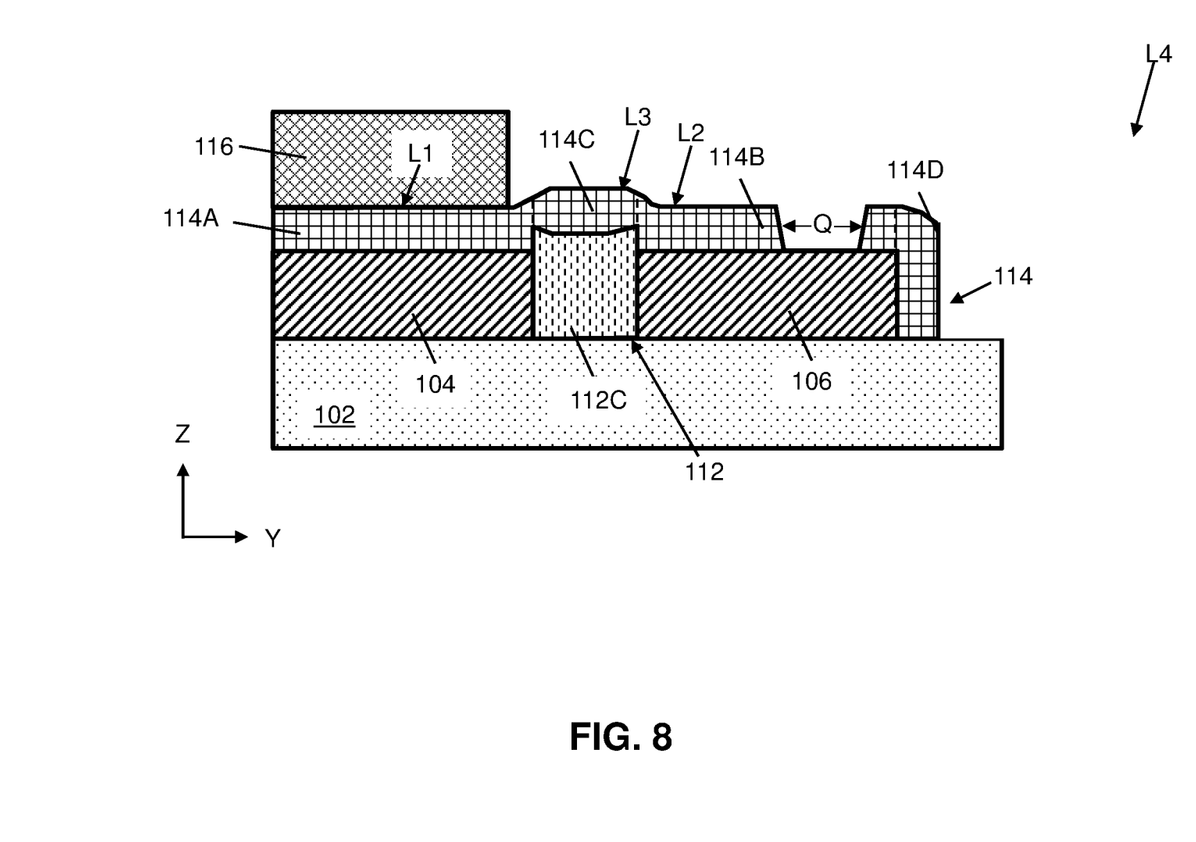
FIG. 8 provides a cross-sectional view of forming a magnetic material, and a via opening, according to embodiments of the disclosure.

Turning to FIG. 8, embodiments of the disclosure may include forming additional elements above first metal layer 104, second metal layer 106, and/or second dielectric material 114. For example, embodiments of the disclosure may include forming a magnetic material 116 on second dielectric material 114. Magnetic material 116 may take the form of a "magnetic core" for an inductor, i.e., a piece of magnetic material with a high magnetic permeability. Where first metal layer 104 and second metal layer 106 take the form of a coil for generating a magnetic field, magnetic material 116 may confine and guide the magnetic field that is output from layers 104, 106. Magnetic material 116 may include one or more ferromagnetic metals such as iron, ferromagnetic compounds such as ferrites, and/or other materials capable of guiding or otherwise altering the direction or intensity of a magnetic field. The high permeability of magnetic material 116 relative to nearby materials may concentrate the magnetic field from layers 104, 106 in magnetic material 116.

Magnetic material 116 may be formed, e.g., by deposition and etching of one or more materials with the above-noted properties. More specifically, magnetic material 116 may be formed on only selected metal layers (e.g., first metal layer 104 as shown) without being formed on other metal layers (e.g., second metal layer 106 as shown). Magnetic material 116 may be vertically above layer(s) 104, 106 but physically separated from the underlying metal(s) by second dielectric material 114. According to an example, first portion 114A of second dielectric material 114 may be directly vertically between first metal layer 104 and magnetic material 116.

FIG. 8 also depicts a process to form vias for electrically coupling first metal layer 104 and/or second metal layer 106 to overlying components. Specifically, embodiments of the disclosure may include forming an opening Q within second dielectric material 114 by removing targeted portions of dielectric material 114 where vias are desired. As noted previously, embodiments of the disclosure may include modifying the etchant-solubility of second dielectric material 114 at targeted locations, e.g., by irradiating portions of second dielectric material 114 through second mask M2 (FIG. 7). By selectively etching second dielectric material 114 after the irradiation, targeted portions of second dielectric material 114 may be removed without affecting other portions of second dielectric material 114. In an illustrative example, opening Q is formed within second portion 114B of second dielectric material 114 without similar openings being formed at other portions 114A, 114B, 114D of second dielectric material 114. In the example of FIG. 8, selected areas of fourth portion 114D may be removed, e.g., such that fourth portion 114D remains intact at a location horizontally adjacent second metal layer 106, but is removed from the surface of substrate 102 at other locations. In other embodiments, additional openings may be formed within other locations of second dielectric material 114, wherever vias are desired. One or more conductive materials may be formed within such openings (e.g., opening Q to second metal layer 106) in subsequent processes.

Figure 9:
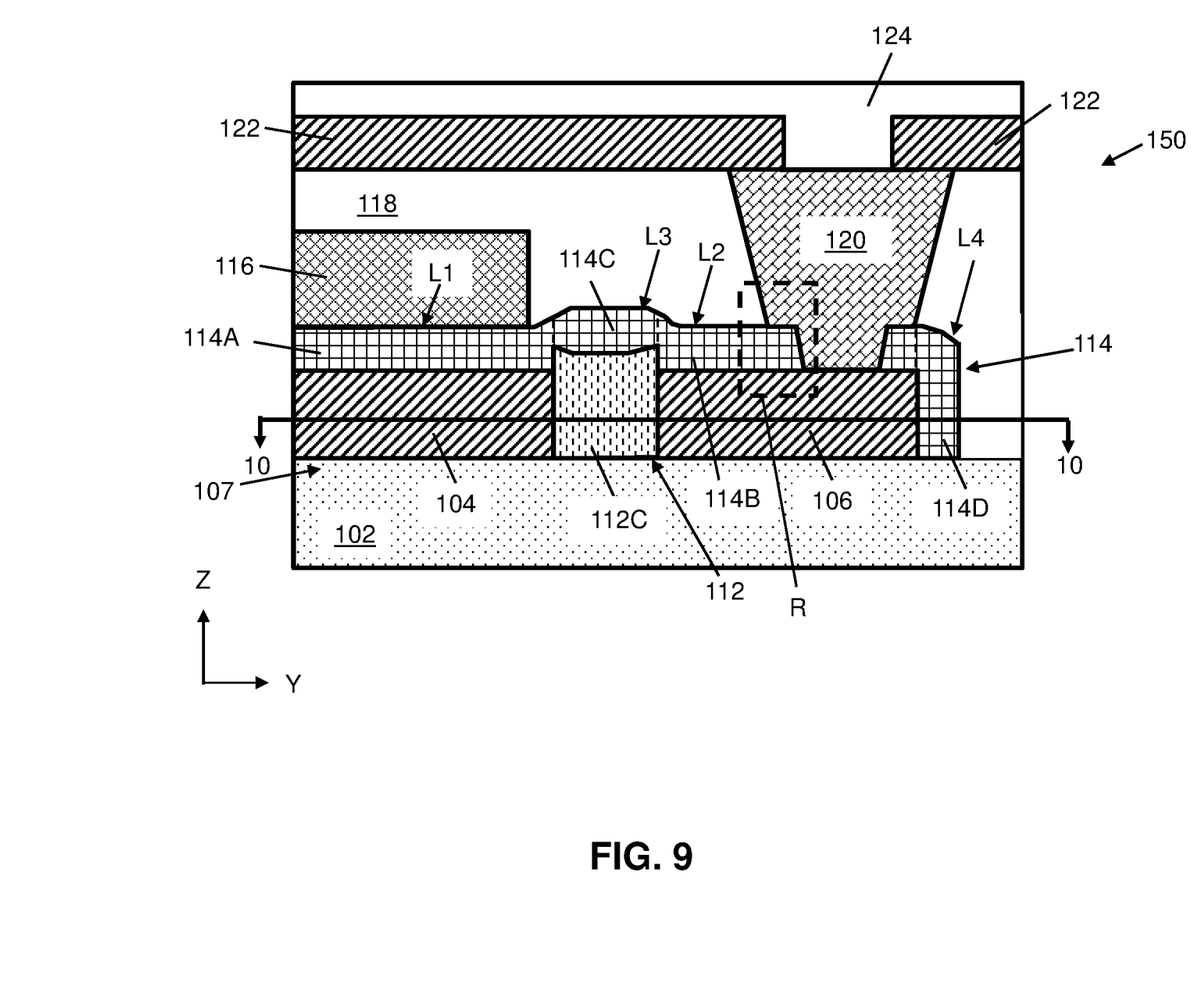
FIG. 9 provides a cross-sectional view in plane Y-Z of an integrated circuit (IC) and inductor structure, according to embodiments of the disclosure.

Referring now to FIG. 9, embodiments of the disclosure can include additional processes (e.g., back end of line or "BEOL" processing) to form additional active and non-active portions of a device. Continued processing may include, e.g., forming an inter-layer dielectric (ILD) 118 over the previously-formed materials to a desired height. ILD 118 may include one or more insulators described herein with respect dielectric material(s) 112, 114, and/or may include any other currently known or later developed insulative material. ILD 118 in various embodiments may include, e.g., silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

After ILD 118 is formed to a desired thickness, a set of openings (not shown) may be formed within ILD 118 and filled with conductive materials to form one or more vias 120. Via(s) 120 may include materials such as copper (Cu), aluminum (Al), and/or any other type of conductive material. Via(s) 120 may extend vertically from the upper surface of ILD 118 to the upper surface of second metal layer 106, and/or to other metal layers (such as first metal layer 104) in further embodiments. Via(s) 120 may be formed such that at least a lower portion of via(s) 120 is located within the previously-formed opening(s) Q (FIG. 8) through second dielectric material 114 (e.g., opening Q (FIG. 8) within second portion 114B). For example, via(s) 120 may extend vertically through an entire height of second dielectric material 114 above second metal layer 106 to have sidewalls adjacent second dielectric material 114 and ILD 118. Due to the separate forming and etching of ILD 118, via 120 may have a horizontally stepped portion R adjacent second portion 114B of second dielectric material 114, and overlying portions of ILD 118. In this case "stepped" refers to a geometrical profile in which the width of via 120 within second dielectric material 114 is less than the width of via 120 within ILD 118. Via(s) 120 may have the same conductive materials, or similar conductive materials, as those included in metal layer(s) 104, 106, e.g., copper, aluminum, etc. Via(s) 120 are illustrated with different cross-hatching solely for clarity of illustration. Via(s) 120 may also include, e.g., refractory metal liners (not shown) to horizontally separate conductive materials of via(s) 120 from second dielectric material 114, ILD 118 and/or other horizontally adjacent materials (not shown). Such liners may include materials such as but not limited to: tantalum nitride (TaN) and tantalum; titanium nitride (TiN) and titanium; titanium and tungsten; tantalum and cobalt; and magnesium (Mn), or combinations thereof.

Continued processing may include, e.g., forming one or more metal wires 122 to via(s) 120. Each metal wire may extend horizontally over ILD 118 and may electrically couple via(s) 120 to other components (not shown) of a device. Metal wire(s) 122 may have the same composition as via(s) 120, and are shown with different cross-hatching solely for clarity of illustration. An overlying dielectric layer 124 may be formed on metal wires(s) 122 to vertically separate metal wire(s) 122 from other materials, e.g., those in overlying metal layers (not shown). Metal wire(s) 122 and overlying dielectric layer 124 collectively may form one "back end layer" of an IC.

Figure 10:
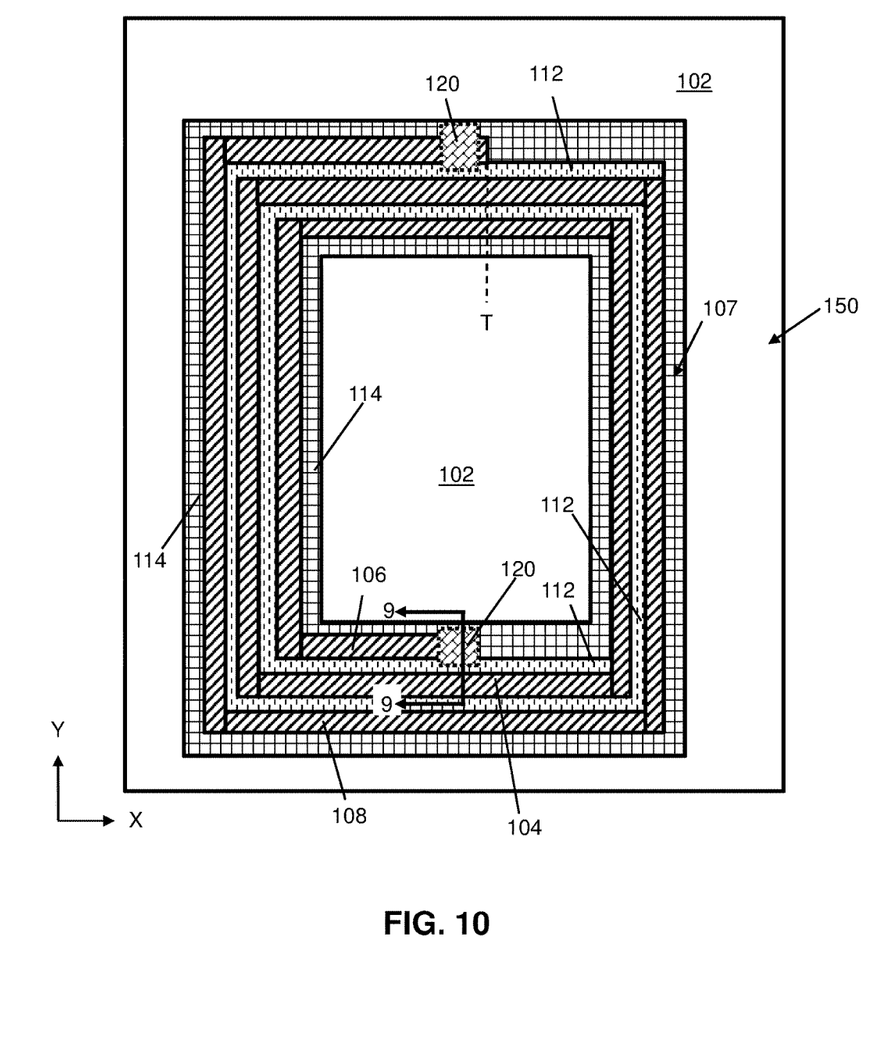
FIG. 10 provides a plan view in plane X-Y of portions of an IC structure, according to embodiments of the disclosure.

Referring to FIGS. 9 and 10 together, embodiments of the disclosure provide an IC structure 150 with one or more structural features discussed herein regarding metal layers 104, 106, 108 (FIG. 10 only) and dielectric materials 112, 114. The plan view shown in FIG. 10 is taken along view line 10-10 of FIG. 9, and thus overlying elements (e.g., second dielectric material 114) are omitted or shown in phantom (e.g., in the case of via(s) 120). IC structure 150 may include, e.g., first metal layer 104, second metal layer 106, and/or third metal layer 108 on substrate 102 that are horizontally separated from each other. Metal layers 104, 106, 108 each may be laterally connected turns of one metal coil 107, as shown by example in FIG. 10. Via(s) 120 may be positioned at the innermost end of second metal layer 106 and the outermost end of third metal layer 108, but the position of via(s) 120 in IC structure 150 may vary by implementation.

IC structure 150 may include first dielectric material 112 horizontally between first metal layer 104 and second metal layer 106. IC structure 150 may also include second dielectric material 114 (FIG. 9 only) with first portion 114A on first metal layer 104, second portion 114B on second metal layer 106, and third portion 114C between metal layers 104, 106. Third portion 114C may include third upper surface L3 that is above first upper surface L1 of first portion 114A and second upper surface L2 of second portion 114B. Although third upper surface L3 is above first upper surface L1 and second upper surface L2, the amount of displacement may be at most approximately 1.5 micrometers (μm) in various implementations. In some cases, second dielectric material 114 may include fourth portion 114D adjacent metal layer(s) 102, 104, 106 with upper surface L4 that is below each of upper surfaces L1, L2, L3. As noted herein, each dielectric material 112, 114 may include one or more polymer materials, and more specifically may include the same polymer material(s) or different polymer material(s). Magnetic material 116 may be positioned over any metal layer 104, 106, 108 where desired, and is shown in FIG. 9 to be over first metal layer 104 as an example. IC structure 150 may also include via(s) 120 to first metal layer 104 and/or second metal layer 106, and moreover may include stepped portion R adjacent the vertical interface between second dielectric material 114 and ILD 118. IC structure 150, may operate as an inductor structure on substrate 102, and may include the various structural features discussed herein arising from methods according to the disclosure, and/or any other structural features described regarding embodiments of IC structure 150.

Embodiments of the disclosure provide several technical and commercial advantages, some of which are discussed by example herein. Embodiments of the disclosure provide IC structure 150 capable of operating as an inductor, in which overlying insulation material (e.g., second dielectric material 114) has greater planarity than conventional structures and/or insulative materials formed by other methods. As noted elsewhere herein, portions of dielectric material between two metal layers may have a raised upper surface compared to other portions of the same material located over the metal layers, but may otherwise exhibit limited variability in height. Embodiments of the disclosure may provide such features using a limited number of masks (e.g., two masks as indicated in FIGS. 4 and 7), and without reliance on chemical mechanical planarization (CMP). Providing second dielectric material 114 with one or more of the physical features described herein may increase the available inductance per area in metal coil 107, without significantly departing from conventional process flows to form an inductor structure within an IC.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a first metal layer on a substrate;
   a second metal layer on the substrate, and horizontally separated from the first metal layer; and
   a dielectric material including:
      a first portion on the first metal layer, and having a first upper surface,
      a second portion on the second metal layer, and having a second upper surface, and
      a third portion on the substrate between the first metal layer and the second metal layer, wherein the third portion of the dielectric material includes a third upper surface above the first upper surface of the first portion and the second upper surface of the second portion of the dielectric material.

2. The IC structure of claim 1, wherein the first metal layer and the second metal layer each include laterally connected turns of a single metal coil on the substrate.

3. The IC structure of claim 1, wherein the dielectric material includes a polymer material.

4. The IC structure of claim 1, wherein the dielectric material includes a first polymer material and a second polymer material on the first polymer material.

5. The IC structure of claim 1, wherein the dielectric material includes a fourth portion on the substrate adjacent the first metal layer or the second metal layer, and having a fourth upper surface is below the first upper surface of the first portion, the second upper surface of the second portion, and the third upper surface of the third portion of the dielectric material.

6. The IC structure of claim 1, further comprising a magnetic material on the dielectric material over the first metal layer or the second metal layer.

7. The IC structure of claim 1, wherein the third upper surface of the third portion of the dielectric material is positioned at most approximately 1.5 micrometers (µm) above the first upper surface of the first portion and the second upper surface of the second portion.

8. The IC structure of claim 1, further comprising a via connected to the first metal layer or the second metal layer, wherein a sidewall of the via includes a horizontally stepped portion adjacent the second upper surface of the second portion of the dielectric material.

9. An inductor structure, comprising:
   a metal coil including a plurality of linearly connected metal layers on a substrate, the plurality of linearly connected metal layers including a first metal layer on the substrate and a second metal layer on the substrate having a portion horizontally separated from the first metal layer;
   a dielectric material including:
      a first portion on the first metal layer of the metal coil, and having a first upper surface,
      a second portion on the second metal layer of the metal coil, and having a second upper surface, and
      a third portion on the substrate between the first metal layer and the second metal layer of the metal coil, wherein the third portion of the dielectric material includes a third upper surface above the first upper surface of the first portion and the second upper surface of the second portion of the dielectric material;
   a magnetic material on the dielectric material above the first metal layer of the metal coil; and
   a via contacting an upper surface of the second metal layer of the metal coil, and extending through the second portion of the dielectric material.

10. The inductor structure of claim 9, wherein the dielectric material includes a polymer material.

11. The inductor structure of claim 9, wherein the dielectric material includes a first polymer material and a second polymer material on the first polymer material.

12. The inductor structure of claim 9, wherein the dielectric material includes a fourth portion on the substrate adjacent an outer perimeter of the metal coil, and having a fourth upper surface that is below the first upper surface of the first portion, the second upper surface of the second portion, and the third upper surface of the third portion of the dielectric material.

13. The inductor structure of claim 9, wherein the third upper surface of the third portion of the dielectric material is positioned at most approximately 1.5 micrometers (µm) above the upper surface of the first metal layer and the upper surface of the second metal layer.

14. The inductor structure of claim 9, wherein a sidewall of the via includes a horizontally stepped metal layer adjacent the upper surface of the second portion of the dielectric material.

* * * * *